United States Patent
Huang et al.

(10) Patent No.: US 12,256,136 B2
(45) Date of Patent: Mar. 18, 2025

(54) CAMERA MODULE WITH REDUCED WIDTH AND ELECTRONIC DEVICE HAVING THE SAME

(71) Applicant: TRIPLE WIN TECHNOLOGY(SHENZHEN) CO. LTD., Shenzhen (CN)

(72) Inventors: Ding-Nan Huang, New Taipei (TW); Ke-Hua Fan, Jincheng (CN); Kun Li, Jincheng (CN); Jing Guo, Jincheng (CN); Han-Ru Zhang, Jincheng (CN)

(73) Assignee: TRIPLE WIN TECHNOLOGY(SHENZHEN) CO. LTD., Shenzhen (CN)

( * ) Notice: Subject to any disclaimer, the term of this patent is extended or adjusted under 35 U.S.C. 154(b) by 241 days.

(21) Appl. No.: 17/980,415

(22) Filed: Nov. 3, 2022

(65) Prior Publication Data
US 2024/0073507 A1 Feb. 29, 2024

(30) Foreign Application Priority Data
Aug. 31, 2022 (CN) .......................... 202211059206.2

(51) Int. Cl.
| H04N 23/57 | (2023.01) |
| G02B 7/10 | (2021.01) |
| H04N 23/54 | (2023.01) |
| H04N 23/55 | (2023.01) |
| H05K 1/18 | (2006.01) |

(52) U.S. Cl.
CPC .............. *H04N 23/57* (2023.01); *G02B 7/10* (2013.01); *H04N 23/54* (2023.01); *H04N 23/55* (2023.01); *H05K 1/181* (2013.01)

(58) Field of Classification Search
CPC . G02B 7/10; G02B 7/02; H04N 23/54; H04N 23/55; H04N 23/00; H05K 1/181; G06F 1/1633
See application file for complete search history.

(56) References Cited

U.S. PATENT DOCUMENTS

| 2011/0102667 A1* | 5/2011 | Chua ...................... H04N 23/57 348/374 |
| 2014/0184899 A1* | 7/2014 | McKinley ................ G03B 5/00 348/373 |
| 2020/0252527 A1* | 8/2020 | Nakamura ............. G03B 17/02 |
| 2020/0348509 A1 | 11/2020 | Ding et al. |
| 2021/0318507 A1* | 10/2021 | Oh ......................... H04N 23/54 |

(Continued)

FOREIGN PATENT DOCUMENTS

| CN | 206743393 U | 12/2017 |
| CN | 207571656 U | 7/2018 |

(Continued)

*Primary Examiner* — Hung H Lam
(74) *Attorney, Agent, or Firm* — ScienBiziP, P.C.

(57) ABSTRACT

A camera module includes a circuit board, a lens assembly, and a first board. The circuit board includes a first surface, a second surface opposite to the first surface, a first sidewall, and a second sidewall opposite to the first sidewall. Each of the first sidewall and the second sidewall connects the first surface to the second surface. The lens assembly is disposed on the first surface. The first board is connected to the first sidewall. The first board is inclined or perpendicular to the first surface. The first board is disposed on a side of the lens assembly.

20 Claims, 6 Drawing Sheets

(56) References Cited

U.S. PATENT DOCUMENTS

| | | | |
|---|---|---|---|
| 2022/0046791 A1* | 2/2022 | Han | H05K 1/144 |
| 2022/0070337 A1* | 3/2022 | Lee | G03B 17/12 |
| 2023/0247272 A1* | 8/2023 | Han | H04N 23/90 |
| | | | 348/373 |

FOREIGN PATENT DOCUMENTS

| | | |
|---|---|---|
| CN | 111935384 A | 11/2020 |
| CN | 217283079 U | 8/2022 |

* cited by examiner

CAMERA MODULE WITH REDUCED WIDTH AND ELECTRONIC DEVICE HAVING THE SAME

FIELD

The subject matter relates to imaging devices, and more particularly, to a camera module and an electronic device having the camera module.

BACKGROUND

Electronic devices are becoming thinner and lighter. Narrow frames and high screen proportion are preferred in the electronic devices. However, the electronic device may also include a camera module mounted in the frame surrounding the display screen. The camera module may increase the width of the frame, which limits the development of the electronic devices.

Therefore, there is room for improvement in the art.

BRIEF DESCRIPTION OF THE DRAWINGS

Implementations of the present technology will now be described, by way of example only, with reference to the attached figures.

DETAILED DESCRIPTION

Figure 1:
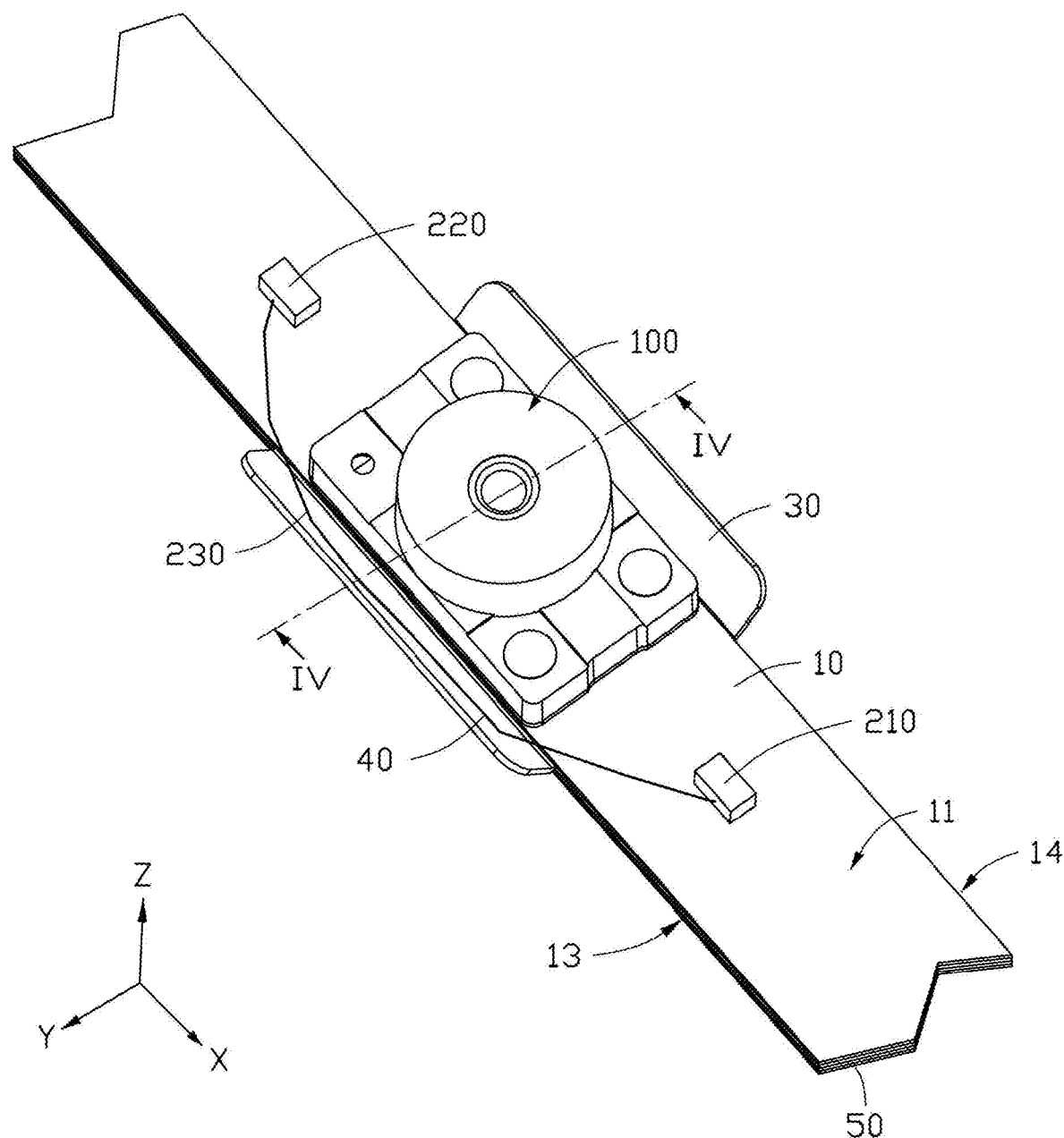
FIG. 1 is a diagrammatic view of a camera module according to an embodiment of the present disclosure.

It will be appreciated that for simplicity and clarity of illustration, where appropriate, reference numerals have been repeated among the different FIGS. to indicate corresponding or analogous components. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Figure 2:
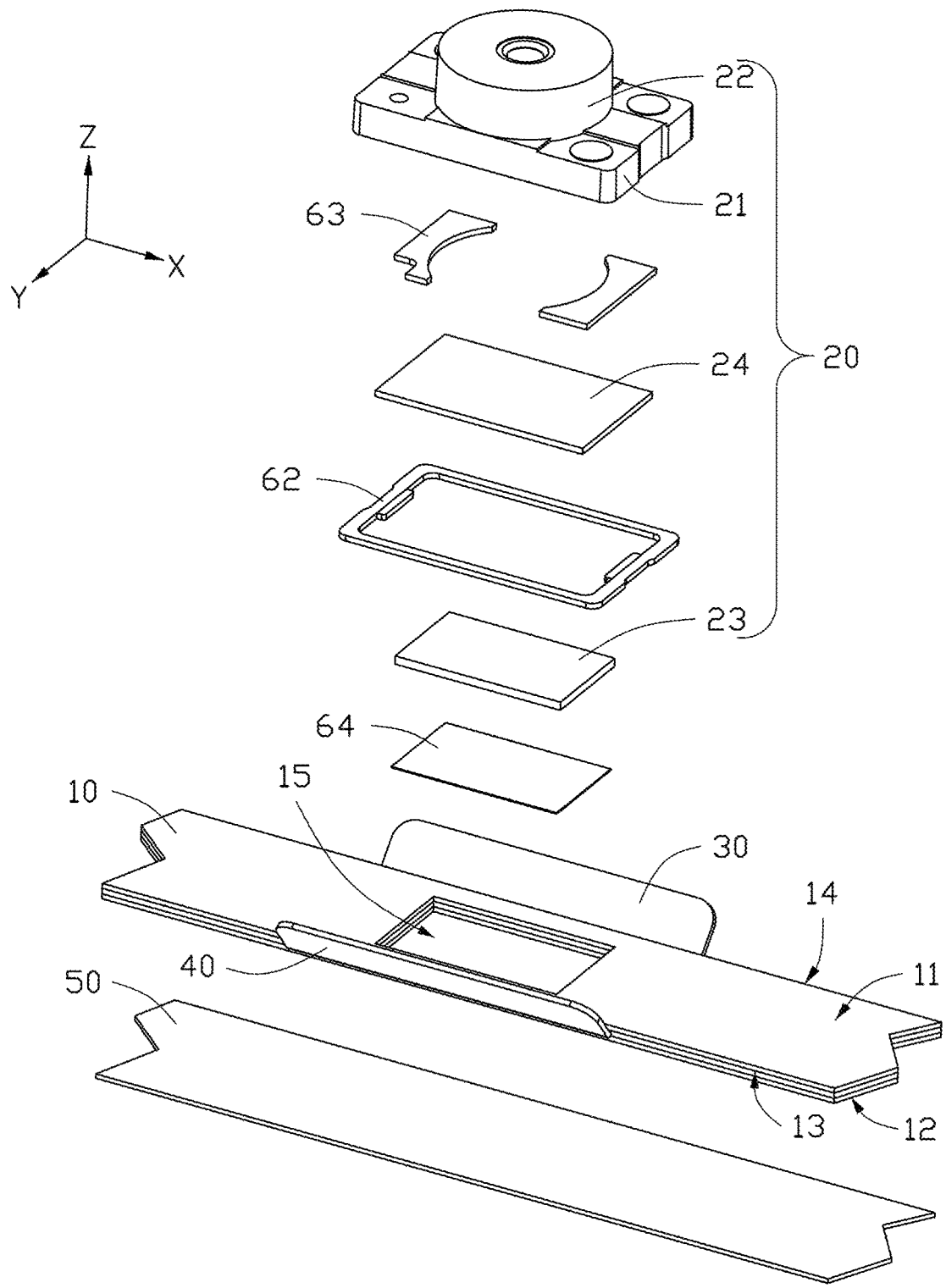
FIG. 2 is an exploded view of the camera module of FIG. 1.
Figure 3:
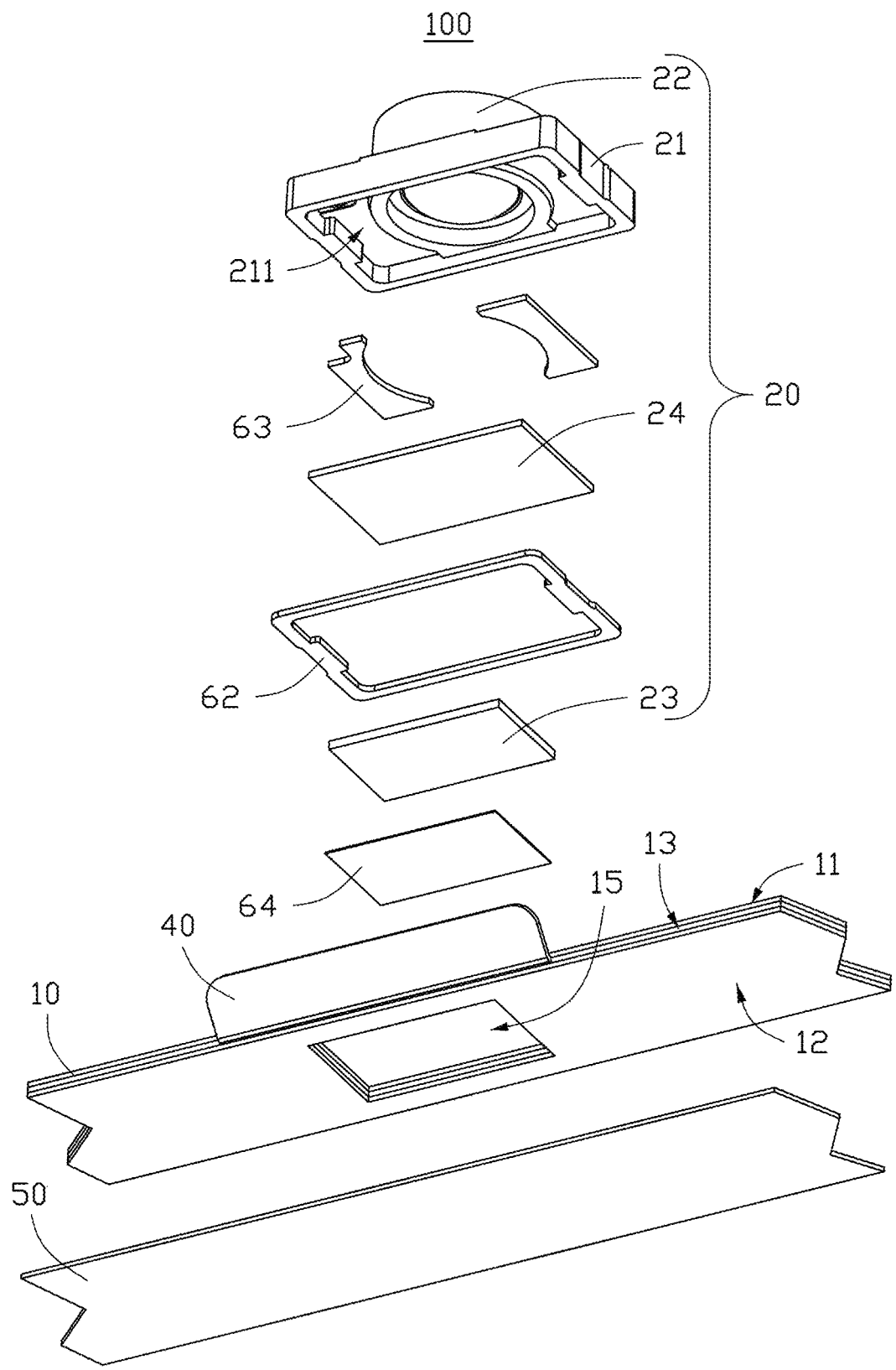
FIG. 3 is similar to FIG. 2, but viewed the camera module from another angle.
Figure 6:
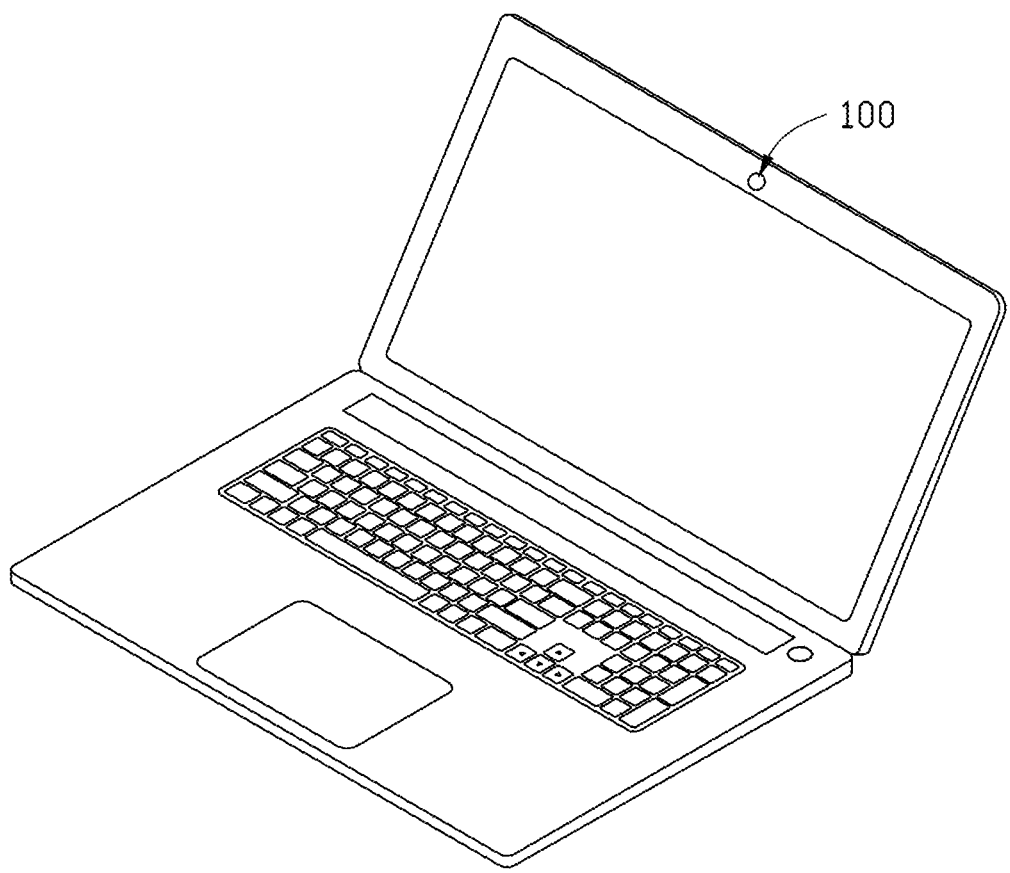
FIG. 6 is diagrammatic view of an electronic device according to an embodiment of the present disclosure.

Referring to FIGS. 1 to 3, a camera module 100 is provided according to an embodiment of the present disclosure, which may be applied in an electronic device 200 (shown in FIG. 6). The camera module 100 includes a circuit board 10, a lens assembly 20, a first board, 30 and a second board 40. The circuit board 10 includes a first surface 11, a second surface 12 opposite to the first surface 11, a first sidewall 13, and a second sidewall 14. Each of the first sidewall 13 and the second sidewall 14 connects the first surface 11 to the second surface 12. The first sidewall 13 is opposite to the second sidewall 14. The lens assembly 20 is disposed on the first surface 11. The first board 30 and the second board 40 are respectively connected to the first sidewall 13 and the second sidewall 14. The lens assembly 20 is between the first board 30 and the second board 40. A first direction X, the second direction Y, and the third direction Z constituting a three-dimensional coordinate axis are defined, which are perpendicular to each other. A direction from the second sidewall 14 to the first sidewall 13 is defined as the second direction Y A direction from the second surface 12 to the first surface 11 is defined as the third direction Z. The lens assembly 20 may be arranged in a middle area of the circuit board 10 along the first direction X.

As shown in FIG. 1, the electronic device 200 further includes a first electronic element 210 and a second electronic element 220 each being disposed on the circuit board 10. At least one wire 230 is provided between the first electronic element 210 to the second electronic element 220, which electrically connects the first electronic element 210 to the second electronic element 220. The first electronic element 210 and the second electronic element 220 are on both sides of the lens assembly 20 in the first direction X. In at least one embodiment, the first electronic element 210 is an image processor, which further electrically connects to the camera module 100. The second electronic element 220 is a photosensitive sensor, which senses a light intensity of an ambient environment of the camera module 100. The image processor, the camera module 100, and the photosensitive sensor need to be connected to form a complete circuit. The circuit transmits signals from the image processor, the camera module 100, and the photosensitive sensor to a processor of the electronic device 200, so that the processor can control the image processor, the camera module 100, and the photosensitive sensor to operate.

The first board 30 provides support for the wire 230. The first board 30 and the second board 40 are arranged on both sides of the lens assembly 20 along the second direction Y. Each of the first board 30 and the second board 40 is inclined with respect to the circuit board 100. Thus, a total width Ly of the camera module 100 in the second direction Y is a sum of a width of the first board 30 in the second direction Y, a width of the second board 40 in the second direction Y, and a width Y of the lens assembly 20 in the second direction Y. Compared with widening the circuit board 10 in the second direction Y for placing the wire 230, the present disclosure reduces the total width of the camera module 100 in the second direction Y, which allows the electronic device 200 to have a high screen proportion.

In at least one embodiment, when a number of wires 230 are included, both the first board 30 and the second board 40 can provide support for the wires 230. That is, a portion of the wires 230 are disposed on the first board 30, and the remaining portion of the wires 230 are disposed on the second board 40.

Figure 4:
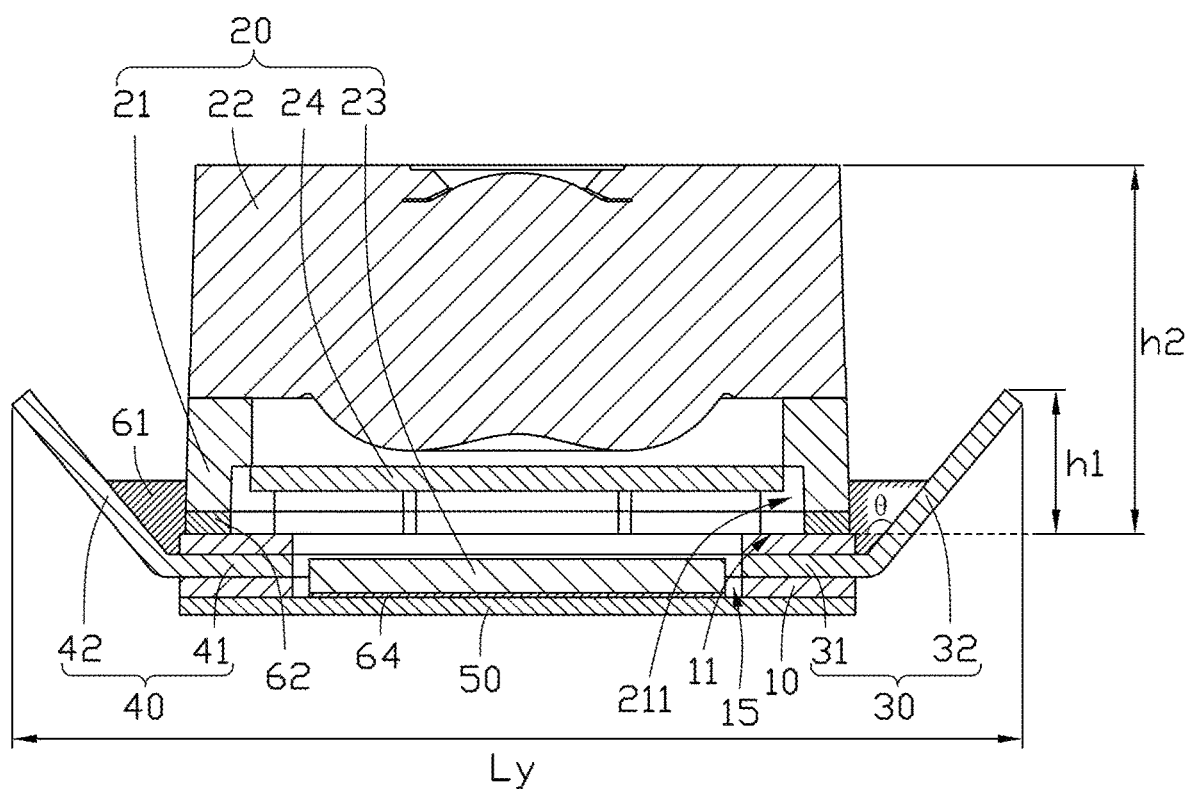
FIG. 4 is a cross-sectional view along IV-IV of FIG. 1.

Referring to FIG. 4, in at least one embodiment, each of the first board 30 and the second board 40 may be a soft-rigid circuit board. The first board 30 includes a first portion 31 and a second portion 32 connected to the first portion 31. The second board 40 includes a third portion 41 and a fourth portion 42 connected to the third portion 41. The first portion 31 and the third portion 41 are soft circuit boards. The second portion 32 and the fourth portion 42 are rigid circuit boards. The first portion 31 and the third portion 41 are embedded in the circuit board 10. The second portion 32 and the fourth portion 42 protrude out of the circuit board 10, and are on both sides of the lens assembly 20 along the second direction Y. Since the first portion 31 and the third portion 41 are soft circuit boards, the first board 30 and the second board 40 are easily bent during manufacture.

In other embodiments, the second portion 32 and the fourth portion 42 are also soft circuit boards. Since a soft circuit board is usually thinner than a rigid circuit board (for example, the thickness of an existing soft circuit board may be 0.1 mm, while the thickness of an existing plate rigid circuit board may reach about 0.25 mm), the total width of the camera module 100 in the second direction Y is further reduced.

Figure 5:
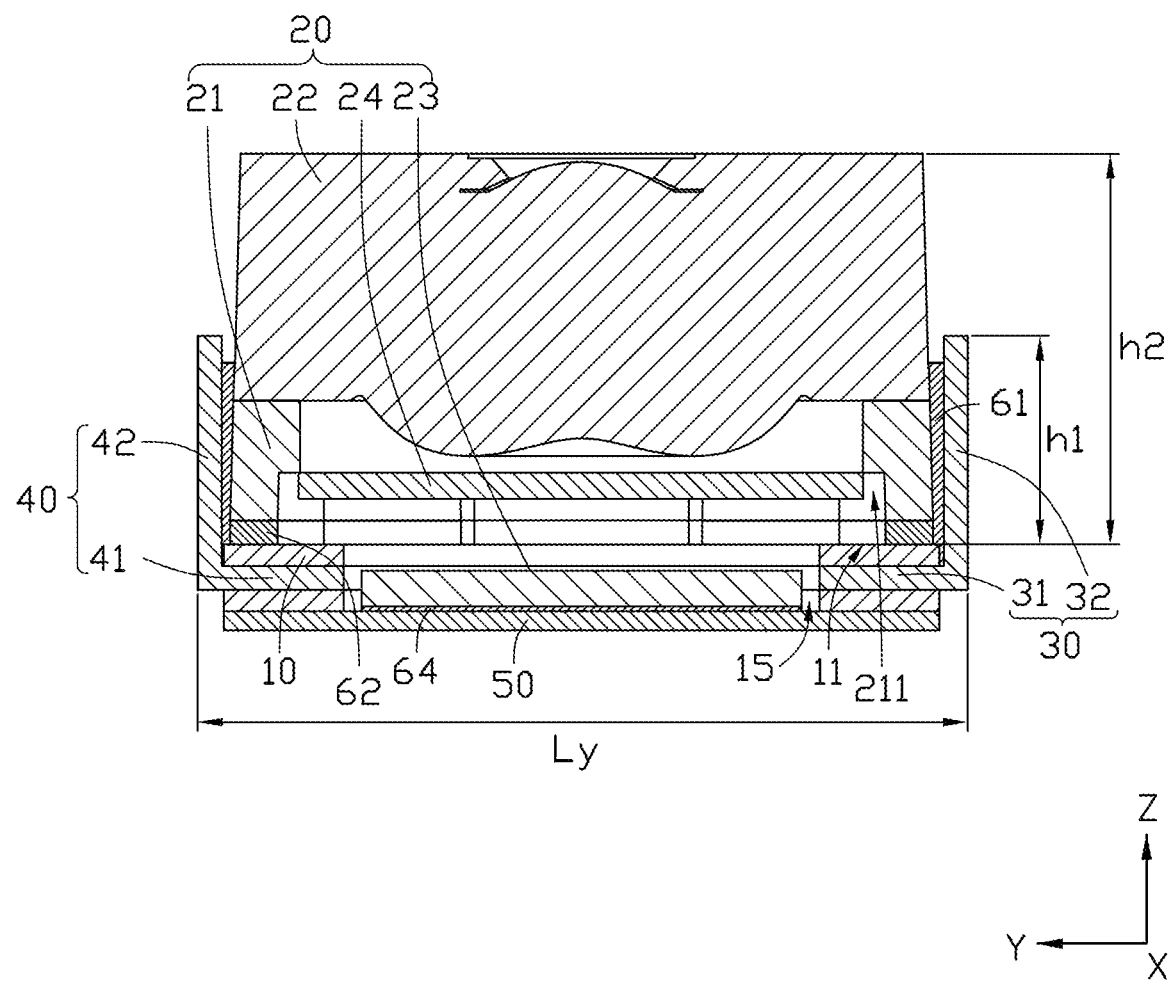
FIG. 5 is a cross-sectional view of a camera module according to another embodiment of the present disclosure.

Referring to FIGS. 5 and 6, in at least one embodiment, an included angle between the second portion 32 and the circuit board 10 is defined as θ, and θ is greater than 90 degrees and less than or equal to 120 degrees. An included angle between the fourth portion 42 and the circuit board 10 may be the same as the included angle θ. Thus, since the second portion 32 is inclined with respect to the circuit board 10 by a certain angle, the width of the second portion 32 in the second direction Y can be reduced. In at least one embodiment, as shown in FIG. 4, when the width of the lens assembly 20 is greater than the width of the circuit board 10 in the second direction Y, the second portion 32 is inclined to and disposed at the side of the lens assembly 20. In other embodiments, when the width of the lens assembly 20 is less than the width of the circuit board 10 in the second direction Y, the second portion 32 is inclined to and disposed at the side of the lens assembly 20.

Referring to FIG. 5, in another embodiment, the included angle θ between the second portion 32 and the circuit board 10 is 90 degrees. That is, the second portion 32 is perpendicular to the circuit board 10. At this time, the width of the second portion 32 is in fact the thickness of the second portion 32. Thus, the total width Ly of the camera module 100 in the second direction Y is a sum of the thickness of the first board 30, the thickness of the second board 40, and the width Ly of the lens head assembly 20 in the second direction Y. At this time, the total width Ly of the camera module 100 in the second direction Y is further reduced.

Referring to FIGS. 2 and 3, in at least one embodiment, the lens assembly 20 includes a lens base 21, a lens 22, a photosensitive chip 23, and a filter 24. The lens base 21 is disposed on the first surface 11.

Referring to FIG. 4, a first adhesive layer 61 is arranged between the first board 30 and the lens base 21. The second portion 32 is mounted on the side of the lens base 21 through the first adhesive layer 61. The fourth portion 42 can also be mounted on the side of the lens base 21 through another adhesive layer. During manufacture, an adhesive layer is first applied on the side surface of the lens base 21. Then, the second portion 32 and/or the fourth portion 42 is bent towards the side of the lens base 21. The adhesive is further solidified to fix the second portion 32 and/or the fourth portion 42.

Referring to FIGS. 2 and 4, in at least one embodiment, the circuit board 10 defines a receiving hole 15 along the third direction Z. The photosensitive chip 23 is disposed in the receiving hole 15. The lens base 21 defines a receiving cavity 211, and the filter 24 is disposed in the receiving cavity 211. The lens 22 is arranged on the lens base 21, and the optical axis of the lens 22 is aligned with the optical axis of the filter 24 and the optical axis of the photosensitive chip 23. By setting the receiving hole 15 on the circuit board 10, the height of the camera module 100 in the third direction Z can be reduced.

In at least one embodiment, a second adhesive layer 62 is arranged between the lens base 21 and the circuit board 10. The lens base 21 is fixed on the first surface 11 through the second adhesive layer 62. In at least one embodiment, a third adhesive layer 63 is arranged between the filter 24 and the lens base 21, and the filter 24 is mounted on the inner wall of the receiving cavity 211 of the lens base 21 through the third adhesive layer 63.

In at least one embodiment, the camera module 100 further includes a reinforcing plate 50 mounted on the second surface 12. The photosensitive chip 23 is arranged on the reinforcing plate 50 to improve a mechanical strength of the camera module 100. A fourth adhesive layer 64 is arranged between the photosensitive chip 23 and the reinforcing plate 50, and the photosensitive chip 23 is fixed on the reinforcing plate 50 through the fourth adhesive layer 64.

Referring to FIGS. 4, in at least one embodiment, when the first board 30 is located on the side of the lens assembly 20, the height h1 of the first board 30 protruding from the first surface 11 is less than or equal to the height h2 of the lens assembly 20 protruding from the first surface 11, to avoid an increase of the total height of the camera module 100 in the third direction Z.

Referring to FIG. 6, an electronic device 200 is further provided according to an embodiment of the present disclosure. The electronic device 200 may be a mobile phone, a wearable device, a vehicle, or a monitoring device. In the present embodiment, the camera module 100 is applied to a laptop computer.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present exemplary embodiments, to the full extent indicated by the plain meaning of the terms in which the appended claims are expressed.

What is claimed is:

1. A camera module applied in an electronic device, the electronic device having a first electronic element, a second electronic element, and a wire connecting the first electronic element to the second electronic element, the camera module comprising:

a circuit board comprising a first surface, a second surface opposite to the first surface, a first sidewall, and a second sidewall opposite to the first sidewall, each of the first sidewall and the second sidewall connecting the first surface to the second surface, the first surface configured to support the first electronic element and the second electronic element; wherein the circuit board has a length direction and a width direction, a direction from the second sidewall to the first sidewall is the width direction;

a lens assembly disposed on the first surface, the first electronic element and the second electronic element located at two sides of the lens assembly in the length direction; and a first board connected to the first sidewall and supporting the wire, the first board being inclined or perpendicular to the first surface, the first board being disposed on a side of the lens assembly.

2. The camera module according to claim 1, further comprising:
a second board connected to the second sidewall, the second board being inclined or perpendicular to the first surface, the second board being disposed on a side of the lens assembly different from the side where the first board is disposed.

3. The camera module according to claim 2, wherein the first board comprises a first portion and a second portion connected to the first portion, the first portion is a soft board and embedded in the circuit board, the second portion is a rigid board and protrudes from the circuit board, the second board is disposed at the side of the lens assembly.

4. The camera module according to claim 3, wherein the first board comprises a first portion and a second portion connected to the first portion, the first portion is a soft board and embedded in the circuit board, the second portion is a soft board and protrudes from the circuit board, the second board is disposed at the side of the lens assembly.

5. The camera module according to claim 3, wherein a height of the second portion protruding from the first surface is less than or equal to a height of the lens assembly.

6. The camera module according to claim 3, wherein a first adhesive layer is arranged between the second portion and the lens assembly.

7. The camera module according to claim 3, wherein an included angle between the second portion and the first surface is greater than 90 degrees, and less than or equal to 120 degrees.

8. The camera module according to claim 3, wherein an included angle between the second portion and the first surface is 90 degrees.

9. The camera module according to claim 1, wherein the circuit board defines a receiving hole extending through the first surface and the second surface, the lens assembly comprises a photosensitive chip disposed in the receiving hole.

10. The camera module according to claim 9, further comprising a reinforcing plate mounted on the second surface, wherein the photosensitive chip is disposed on the reinforcing plate.

11. An electronic device, comprising:
a first electronic element, a second electronic element, and a wire connecting the first electronic element to the second electronic element; and
a camera module, comprising:
a circuit board comprising a first surface, a second surface opposite to the first surface, a first sidewall, and a second sidewall opposite to the first sidewall, each of the first sidewall and the second sidewall connecting the first surface to the second surface, the first electronic element and the second electronic element disposed on the first surface; wherein the circuit board has a length direction and a width direction, a direction from the second sidewall to the first sidewall is the width direction;
a lens assembly disposed on the first surface, the first electronic element and the second electronic element located at two sides of the lens assembly in the length direction; and
a first board connected to the first sidewall and supporting the wire, the first board being inclined or perpendicular to the first surface, the first board being disposed on a side of the lens assembly.

12. The electronic device according to claim 11, wherein the camera module further comprises:
a second board connected to the second sidewall, the second board being inclined or perpendicular to the first surface, the second board being disposed on another side of the lens assembly.

13. The electronic device according to claim 11, wherein the first board comprises a first portion and a second portion connected to the first portion, the first portion is a soft board and embedded in the circuit board, the second portion is a rigid board and protrudes from the circuit board, the second board is disposed at the side of the lens assembly.

14. The electronic device according to claim 13, wherein the first board comprises a first portion and a second portion connected to the first portion, the first portion is a soft board and embedded in the circuit board, the second portion is a soft board and protrudes from the circuit board, the second board is disposed at the side of the lens assembly.

15. The electronic device according to claim 13, wherein a height of the second portion protruding from the first surface is less than or equal to a height of the lens assembly.

16. The electronic device according to claim 13, wherein a first adhesive layer is arranged between the second portion and the lens assembly.

17. The electronic device according to claim 13, wherein an included angle between the second portion and the first surface is greater than 90 degrees, and less than or equal to 120 degrees.

18. The electronic device according to claim 13, wherein an included angle between the second portion and the first surface is 90 degrees.

19. The electronic device according to claim 11, wherein the circuit board defines a receiving hole extending through the first surface and the second surface, the lens assembly comprises a photosensitive chip disposed in the receiving hole.

20. The electronic device according to claim 19, wherein the camera module further comprises a reinforcing plate mounted on the second surface, the photosensitive chip is disposed on the reinforcing plate.

* * * * *